United States Patent
Lee et al.

(10) Patent No.: US 8,933,749 B2
(45) Date of Patent: Jan. 13, 2015

(54) CIRCUITS AND METHODS FOR CALIBRATING OFFSET IN AN AMPLIFIER

(71) Applicant: Marvell World Trade Ltd., St. Michael (BB)

(72) Inventors: Winston Lee, Palo Alto, CA (US); Peter Lee, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 95 days.

(21) Appl. No.: 13/723,401

(22) Filed: Dec. 21, 2012

(65) Prior Publication Data

US 2013/0294179 A1 Nov. 7, 2013

Related U.S. Application Data

(63) Continuation of application No. 12/961,422, filed on Dec. 6, 2010, now Pat. No. 8,339,195.

(60) Provisional application No. 61/285,484, filed on Dec. 10, 2009.

(51) Int. Cl.
*H03F 1/02* (2006.01)

(52) U.S. Cl.
USPC .............................. 330/9; 330/253; 327/307

(58) Field of Classification Search
USPC ...................... 330/9, 253; 327/307
See application file for complete search history.

(56) References Cited

U.S. PATENT DOCUMENTS

| 5,008,612 | A | 4/1991 | Otto |
| 5,434,821 | A | 7/1995 | Watanabe et al. |
| 7,271,649 | B2 * | 9/2007 | Chiu et al. ................. 330/9 |
| 7,321,259 | B1 * | 1/2008 | Shumarayev ............. 330/9 |
| 7,636,013 | B2 * | 12/2009 | Bach ....................... 330/2 |
| 7,940,105 | B2 * | 5/2011 | Quesada et al. ......... 327/307 |
| 8,624,669 | B2 * | 1/2014 | Lesso ....................... 330/9 |
| 2002/0175732 | A1 | 11/2002 | Blon et al. |
| 2005/0231275 | A1 | 10/2005 | Wang |
| 2007/0013440 | A1 | 1/2007 | Chen et al. |
| 2007/0086255 | A1 | 4/2007 | Lin et al. |

FOREIGN PATENT DOCUMENTS

JP 2008263760 10/2008

* cited by examiner

*Primary Examiner* — Patricia Nguyen

(57) ABSTRACT

In one embodiment, the present disclosure includes a circuit comprising an amplifier having an input and an output, an offset detection circuit to detect an offset of the amplifier at the output of the amplifier, and an offset generation circuit having an input coupled to the offset detection circuit and an output coupled to the input of the amplifier to generate an offset at the input of the amplifier during an operational phase of the amplifier based on the detected offset. The generated offset cancels a least a portion of the offset of the amplifier. In one implementation, the amplifier is a sense amplifier in a memory.

23 Claims, 4 Drawing Sheets

US 8,933,749 B2

CIRCUITS AND METHODS FOR CALIBRATING OFFSET IN AN AMPLIFIER

CROSS REFERENCE TO RELATED APPLICATIONS

The present disclosure is a continuation of U.S. patent application Ser. No. 12/961,422, filed Dec. 6, 2010 now U.S. Pat. No. 8,339,195 issued on Jun. 16, 2011, which claims the benefit of priority under 35 U.S.C. §119(e) from U.S. Provisional Application No. 61/285,484, filed Dec. 10, 2009, each of which is incorporated herein by reference in its entirety.

BACKGROUND

The present disclosure relates to circuits and methods for offset calibration in amplifier circuits.

Unless otherwise indicated herein, the approaches described in this section are not prior art to the claims in this application and are not admitted to be prior art by inclusion in this section.

Amplifier circuits are basic building blocks of many electronic systems. Amplifier circuits (or "amplifiers") are used to increase a particular characteristic of a signal, such as voltage, current, or power, for example. Amplifiers typically have offset. For example, when an amplifier input is zero, ideally the output should also be zero. However, due to the internal construction limitations of most amplifiers, when the input of an amplifier is zero, the amplifier will typically generate a non-zero output. This non-ideality is referred to as the offset of the amplifier.

Particular embodiments described below reduce offset in amplifiers.

SUMMARY

Embodiments of the present disclosure include amplifier circuits with reduced offsets. In one embodiment, the present invention includes a circuit comprising an amplifier having an input and an output, an offset detection circuit configured to detect an offset of the amplifier at the output of the amplifier, and an offset generation circuit having an input coupled to the offset detection circuit and an output coupled to the input of the amplifier configured to generate an offset at the input of the amplifier during an operational phase of the amplifier based on the detected offset. The generated offset is configured to cancel a least a portion of the offset of the amplifier.

In one embodiment, the offset detection circuit is configured to detect offset at the output of the amplifier during a calibration phase to generate the offset at the input of the amplifier and the offset at the input of the amplifier is maintained during the operational phase.

In one embodiment, the offset generation circuit produces a current into the input of the amplifier to cancel at least a portion of the offset of the amplifier.

In one embodiment, the amplifier comprises a second input, and the offset generation circuit generates the first offset into the first amplifier input when the detected offset at the output of the amplifier has a first polarity and the offset generation circuit generates a second offset into the second amplifier input when the detected offset at the output of the amplifier has a second polarity.

In one embodiment, the offset generation circuit receives a digital signal to generate a particular offset value at the input of the amplifier, and the digital signal is changed to produce a plurality of offset values to reduce the offset of the amplifier.

In one embodiment, the amplifier is a sense amplifier in a memory. The sense amplifier comprises a first input coupled to a first output of a memory cell and a second input coupled to a second output of the memory cell. The offset generation circuit comprises a first current generator coupled to the first input of the sense amplifier and a second current generator coupled to the second input of the sense amplifier.

In one embodiment, a plurality of the sense amplifiers are calibrated simultaneously in response to a single control signal.

In one embodiment, the present invention includes a method comprising detecting a first offset of an amplifier at an output of the amplifier and generating, during an operational phase of the amplifier, a second offset at an input of the amplifier based on the first offset, where the second offset cancels a least a portion of the first offset of the amplifier.

In one embodiment, detecting the first offset is performed during a calibration phase to generate the second offset at the input of the amplifier, and the second offset at the input of the amplifier is maintained during the operational phase.

In one embodiment, the amplifier comprises a second input, and generating the second offset comprises generating the second offset into the first amplifier input when the first offset at the output of the amplifier has a first polarity and generating the second offset into the second amplifier input when the first offset at the output of the amplifier has a second polarity.

In one embodiment, the method further includes receiving, by an offset generation circuit, a digital signal to generate a particular second offset value at the input of the amplifier, where the digital signal is changed to produce a plurality of second offset values to reduce the first offset of the amplifier.

In one embodiment, the amplifier is a sense amplifier in a memory. The input of the amplifier is a first input coupled to a first output of a memory cell and the sense amplifier comprises a second input coupled to a second output of the memory cell, where generating the second offset comprises generating a first current to the first input of the sense amplifier when the first offset at the output of the amplifier has a first polarity and generating a second current to the second input of the sense amplifier when the first offset at the output of the amplifier has a second polarity.

The following detailed description and accompanying drawings provide a better understanding of the nature and advantages of the present invention.

DETAILED DESCRIPTION

Described herein are techniques for reducing offset in amplifiers. In the following description, for purposes of explanation, numerous examples and specific details are set forth in order to provide a thorough understanding of particular embodiments. The circuits and methods disclosed herein may be used in a variety of electronic systems. Further, the circuits and methods describe herein may be implemented on an integrated circuit (IC). Particular embodiments as defined by the claims may include some or all of the features in these examples alone or in combination with other features described below, and may further include modifications and equivalents of the features and concepts described herein.

Figure 1:
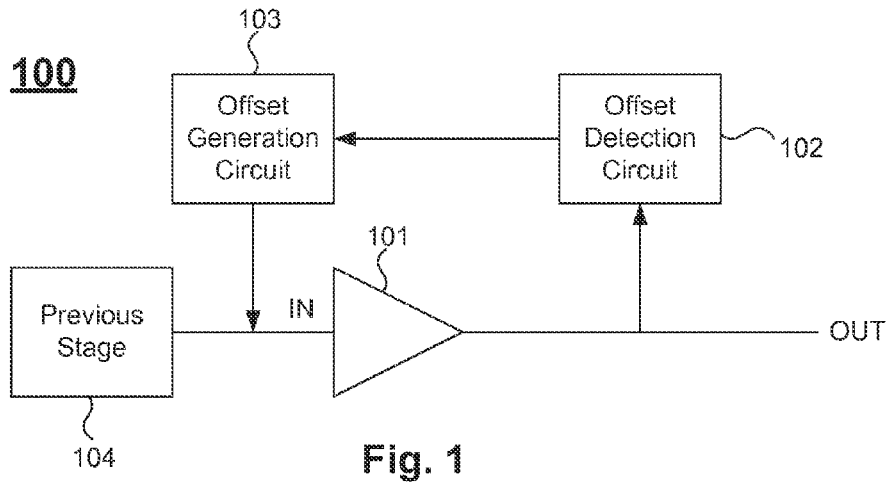
FIG. 1 illustrates an amplifier circuit according to one embodiment.

FIG. 1 illustrates an amplifier circuit according to one embodiment. Circuit 100 includes an amplifier 101 having an input ("IN") and an output ("OUT"). The output of amplifier 101 is coupled to an offset detection circuit 102. Offset detection circuit 102 detects offset at the output of the amplifier. The offset at the input and/or output of the amplifier may be an offset voltage, for example. Offset detection circuit 102 is coupled to an offset generation circuit 103. Offset generation circuit 103 generates an offset at the input of the amplifier 101. The generated offset is opposite in polarity to the offset of the amplifier so that the offset of the amplifier is reduced. A previous stage 104 may be coupled to the input of amplifier 101. Previous stage 104 may provide an input signal to the input of amplifier 101, and the input signal is amplified by amplifier 101 during normal operation.

In one embodiment, amplifier 101 operates in a calibration phase and an operational phase. During the calibration phase, the input of amplifier 101 may be set to a particular value (e.g., ground) and offset detection circuit 102 detects the offset at the output of amplifier 101. In response to the detected offset, offset generation circuit 103 generates an offset at the input of amplifier 101 to cancel the offset of amplifier 101. During the operational phase, offset generation circuit 103 maintains the offset at the input of amplifier 101 to cancel the detected offset of amplifier 101. Accordingly, previous stage 104 may generate input signals to amplifier 101 during the operational phase, and the input signals will be amplified with reduced offset.

In a particular embodiment, offset generation circuit 103 produces a current into the input of amplifier 101 to cancel at least a portion of the offset of the amplifier. For example, the input of amplifier 101 may have an associated capacitance, C. Offset generation circuit 103 may produce a current into capacitance, C, over a particular time period to produce a change in voltage that cancels out an offset voltage of amplifier 101 according to the following equation: $Ios*t/C=\Delta V$, where Ios is the current generated at the input of amplifier 101 by offset generation circuit 103, t is the time period, and $\Delta V$ is the generated offset at the input that cancels the amplifier offset.

In another particular embodiment, offset generation circuit 103 receives a digital signal to generate a particular offset value at the input of amplifier 101 and the digital signal is changed to produce a plurality of offset values to reduce offset of amplifier 101. For example, offset detection circuit 102 may generate digital signals in response to detecting offset at the output of amplifier 102. The digital signals may be a single digital bit indicating that a voltage on the output of amplifier 101 is above or below a particular value, or the digital signals may be multiple digital bits specifying the value of the voltage on the output of amplifier 101, for example. Offset generation circuit 103 may receive the digital signals and generate an offset voltage to cancel the offset of the amplifier. For example, if offset detection circuit 102 detects that the voltage on the output of amplifier 101 is above zero volts, then offset generation circuit 103 may generate −100 mV of offset. Offset detection circuit 102 may detect offset at the output of amplifier 101 again. If the voltage on the output of amplifier 101 is still above zero volts, then the offset of the amplifier is greater than 100 mV and more canceling offset may be generated. However, if the voltage on the output of amplifier 101 is now below zero volts, then the offset of the amplifier is less than 100 mV and less cancelling offset may be generated. A more detailed algorithm for detecting and reducing amplifier offset according to one embodiment is provided below.

Figure 2:
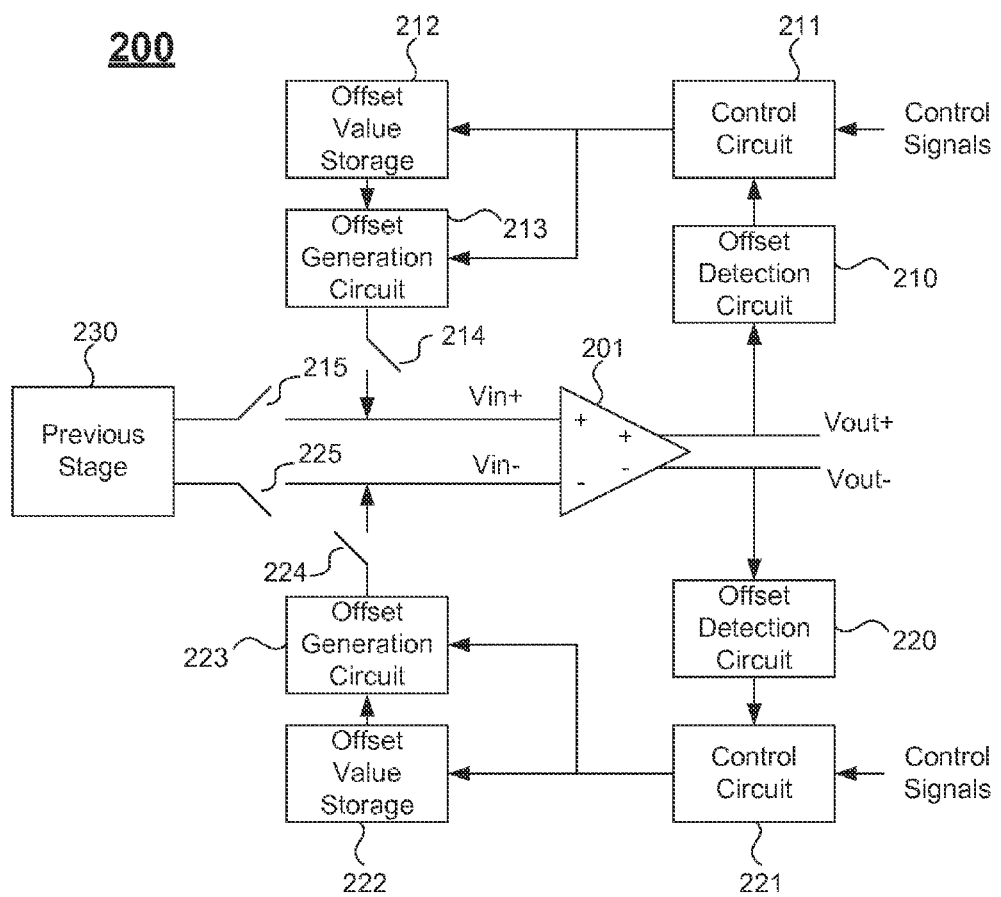
FIG. 2 illustrates an amplifier circuit according to another embodiment.

FIG. 2 illustrates an amplifier circuit according to another embodiment. Circuit 200 includes an amplifier 201 having a first input (+) and a second input (−). In this example, amplifier 201 has a differential output with a first output (+) and a second output (−). First and second offset calibration circuitry may be used to calibrate offset during a calibration phase. For instance, first calibration circuitry coupled between the first input and first output includes offset detection circuit 210, control circuit 211, offset value storage 212, and offset generation circuit 213. Second calibration circuitry coupled between the second input and second output includes offset detection circuit 220, control circuit 221, offset value storage 222, and offset generation circuit 223. In this example, control circuits 211 and 221 receive digital control signals to configure circuit 200 to calibrate for offset during the calibration phase. Control circuits 211 and 221 may include digital logic and registers for processing and storing digital signals to perform a calibration algorithm, for example. During calibration phase, a previous stage 230 may be decoupled from the first input and second input of amplifier 201 when control circuits 211 and 221 send signals to open switches 215 and 225. Further, control circuits 211 and 221 may send signals to close switches 214 and 224 to inject offset to the first input, the second input, or both the first and second inputs of amplifier 201.

In this example, offset detection circuit 210 has an input coupled to the first output of amplifier 201 to detect offset of amplifier 201. An output of offset detection circuit 210 is coupled to control circuit 211, and control circuit 211 generates digital signals in response to the detected offset. An output of control circuit 211 is coupled to offset generation circuit 213 to configure offset generation circuit 213 to generate an offset at the first input of amplifier 201. Similarly, offset detection circuit 220 has an input coupled to the second output of amplifier 201 to detect offset of amplifier 201. An output of offset detection circuit 220 is coupled to control circuit 221, and control circuit 221 generates digital signals in response to the detected offset. An output of control circuit 221 is coupled to offset generation circuit 223 to configure offset generation circuit 223 to generate an offset at the second input of amplifier 201. Offset may be detected and an input offset that cancels the offset of the amplifier (e.g., a cancelling offset) may be determined during the calibration phase mentioned above. At the end of the calibration phase, digital values may be stored in either or both of offset value storage blocks 212 or 222. Accordingly, during an operational phase, values stored in one or both of the offset value storage blocks 212 or 222 may be accessed to generate a cancelling offset at the input of amplifier 201.

While a variety of algorithms may be used to determine an optimum offset to generate to reduce the offset of amplifier 201, in one embodiment a successive approximation may be used. For instance, control signals received by control circuit 211 and control circuit 221 may cause the circuit to perform successive approximation to determine an offset to reduce the offset of amplifier 201. The successive approximation may be performed during a calibration phase that occurs before or between operational phases of amplifier 201, for example.

Figure 3:
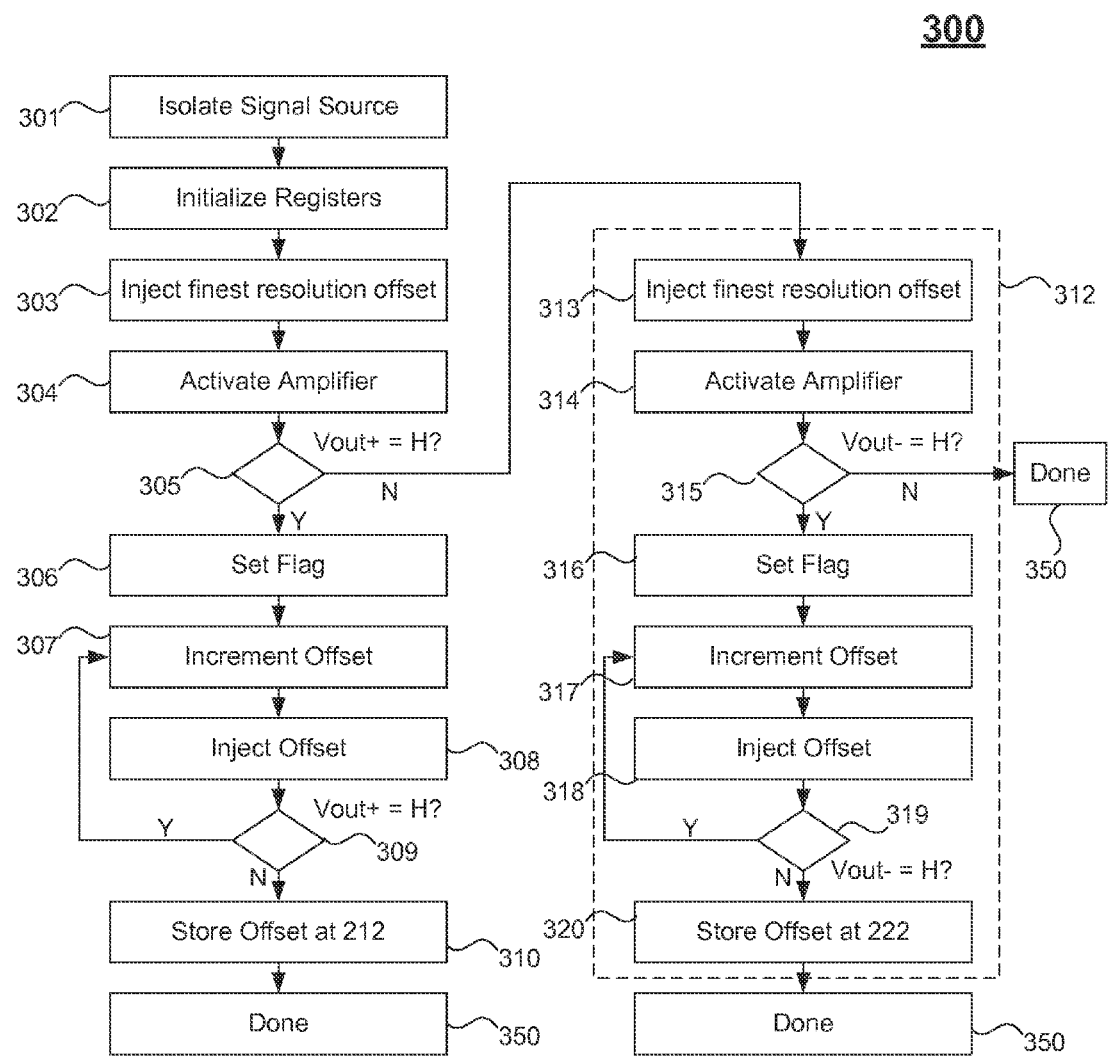
FIG. 3 illustrates a calibration algorithm according to another embodiment.

FIG. 3 illustrates a calibration algorithm according to another embodiment. The following example of a calibration algorithm may be used to determine an offset to generate to reduce the offset of an amplifier. At 301, a signal source is isolated. For example, referring to FIG. 2, switches 215 and 225 may be opened. Additionally, in some embodiments, registers may be used to store flags specifying whether or not offset injection is needed (e.g., "offset injection needed" flags). Offset may be injected into either a positive or negative input of an amplifier. Therefore, in one embodiment, positive and negative "offset injection needed" flags may be used. At 302, the "offset injection needed" flags are initialized to false, for example. At 303, a finest resolution of offset may be injected by offset generation circuit 213 by closing switch 214. For example, offset generation circuits 213 and 223 may generate offset across a range of values in particular increments (e.g., voltage or current steps), such as 0-1v in 50 mV increments. In this example, offset generation circuit 213 may start by injecting the smallest offset (e.g., −50 mV) at 303 into the positive input of amplifier 201. Here, the generated offset is a negative value, for example. At 304, the amplifier may be activated, and offset detection circuit 210 detects whether or not the positive output is high. If the positive output is high (Vout+=H), then the positive "offset injection needed" flag is set (e.g., "true") at 306.

If the positive output of the amplifier is high when a negative offset is injected into the positive input, then such a condition indicates that the offset of the amplifier is greater than the injected offset. Accordingly, to further cancel the amplifier offset, the injected offset is increased to the next increment at 307 (e.g., −100 mV). For example, if the injected offset is represented by the variable X and the increment is represented by the variable Dn, then Xn=Xo+Dn, where Xn is the "nth" increment and Xo is the previous value. At 308, the new offset is injected into the positive input. If the positive output is still high (Vout+=H) at 309, then the process returns to 307 for further increments. If the positive output goes low (Vout+=L) at 309, then the final offset is stored at 310 (e.g., in offset value storage 212 of FIG. 2) and the process stops at 350. An offset generation circuit may include a digital-to-analog converter for receiving bits stored in a register or from a control circuit and for translating the digital bits into analog voltages or currents for generating an offset, for example.

If the positive output is low (Vout+=L) at 305, then such a condition indicates the amplifier may have a negative offset. Accordingly, the processes repeated for the negative input of the amplifier as illustrated by the steps shown at 312. In this case, a negative offset is injected into the negative input at 313, and the condition on the detected output at 315 is high (Vout−=H?). For example, if a negative offset is injected by offset generation circuit 223 in FIG. 2 through switch 224 and the output is high at 315, then the negative "offset injection needed" flag is set at 316 and the generated offset is iteratively incremented, injected, and stored at steps 317-320 until the amplifier offset is canceled. The final generated offset may be stored in offset value storage 222 in FIG. 2, for example. In some embodiments, calibration may be completed in as few as two clock cycles, where each clock cycle performs one iteration, for example.

After calibration, an offset corresponding to the value stored during the calibration phase may be injected into the input signal path during an operational phase. For example, during an operational phase, switches 215 and 225 are closed and an input signal may be received on the inputs of amplifier 201. If the "offset injection needed" flag is set during calibration phase, then offset will be generated. For example, if the positive "offset injection needed" flag was set, then offset is generated by offset generation circuit 213 into the positive input of amplifier 201 based on the value stored in offset value storage 212. Similarly, if the negative "offset injection needed" flag was set, then offset is generated by offset generation circuit 223 into the positive input of amplifier 201 based on the value stored in offset value storage 222. Accordingly, either no offset will be injected (neither flag set) or offset will be injected to the positive or negative inputs of amplifier 201 depending on the values of the positive and negative flags. The flags may be stored in flip flops or registers in control circuits 211 or 221, for example.

Figure 4:
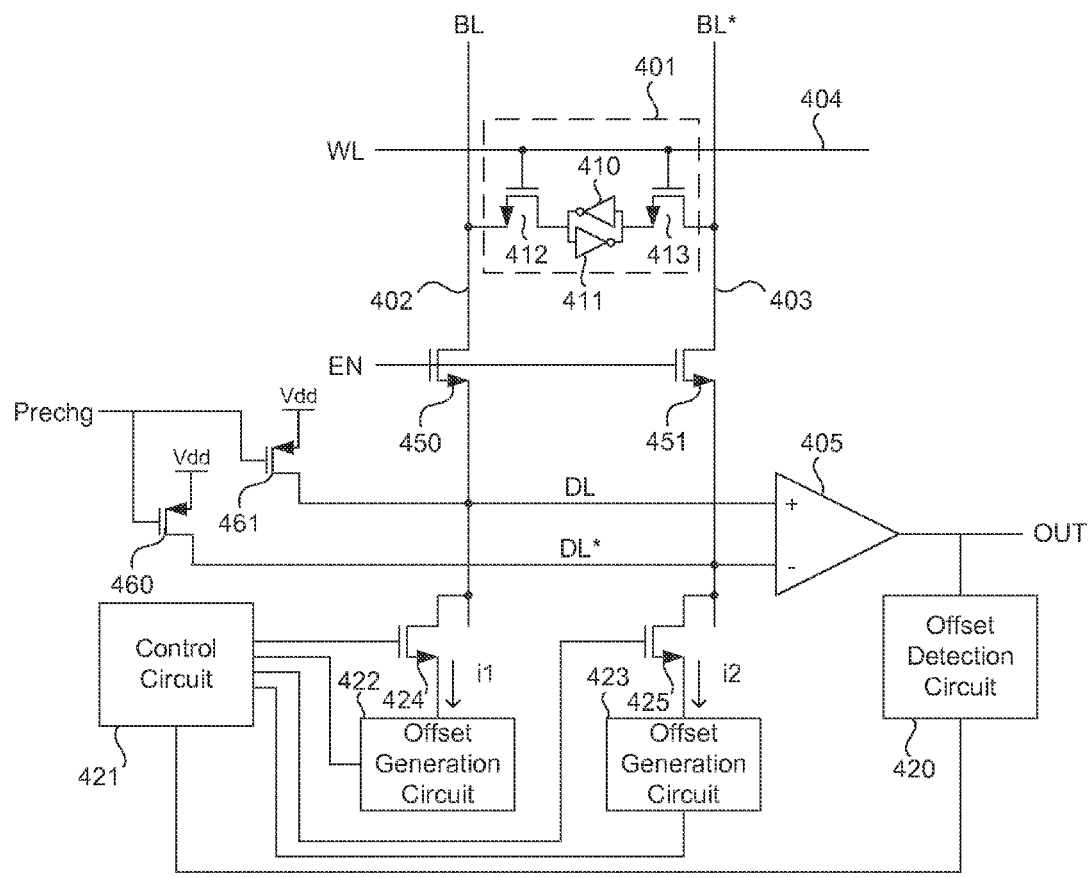
FIG. 4 illustrates a memory including a sense amplifier circuit according to another embodiment.

FIG. 4 illustrates a sense amplifier circuit in a memory circuit 400 according to another embodiment. In this example application, a memory may include numerous memory cells, such as example memory cell 401. The memory cell 401 is coupled to two bit lines, BL 402 and BL* 403, where BL* is the complement of BL. Bit line 402 is coupled through a transistor 450, for example, to a positive input of a sense amplifier 405. Similarly, bit line 403 is coupled through a transistor 451 to a negative input of sense amplifier 405. Transistors 450 and 451 may be turned on and off by an enable signal (EN), for example. An output (OUT) of amplifier 405 is coupled to an offset detection circuit 420. Transistors 450 and 451 may act as a column select to multiple BL/BL* signal pairs to the input of the sense amplifier 405. The inputs of sense amplifier 405 are sometimes referred to as data lines (e.g., DL/DL*). Offset detection circuit 420 detects an offset of amplifier 405 at the output of amplifier 405. As described in more detail below, offset detection may be performed with column select transistors 450 and 451 turned on or off. Offset detection circuit 420 is coupled to control circuit 421. Control circuit 421 may include digital circuits to receive digital signals from offset detection circuit 420 and generate digital signals to offset generation circuits 422 and 423. Control circuit 421 may have outputs coupled to the gates of transistors 424 and 425 turn transistors 424 and 425 to on and off. Thus, in this example, transistors 424 and 425 act as switches to connect and disconnect offset generation circuits 422 and 423 to the positive and negative inputs of amplifier 405, respectively.

In this example, offset generation circuits 422 and 423 generate currents i1 and i2, respectively. Current i1 from offset generation circuit 422 may be selectively coupled through transistor 424 to the positive input of amplifier 405 during a read operation to reduce the offset of amplifier 405. Similarly, current i2 from offset generation circuit 423 may be selectively coupled through transistor 425 to the negative input of amplifier 405 during a read operation to reduce the offset of amplifier 405. Offset in amplifier 405 may be canceled by iteratively generating offsets into the positive or negative inputs of amplifier 405, or both, as described above during a calibration phase or using another offset calibration algorithm. The generated offset is opposite in polarity to the offset of the amplifier so that the effects of the amplifier offset are reduced or canceled completely. A final offset may be stored in a register for use during an operational phase, for example.

During the operational phase, such as a read operation, word line 404 is activated to turn on transistors 412 and 413. A data bit stored on inverters 410 and 411 as a voltage is coupled to the inputs of amplifier 405. Inverter 410 sources or sinks current into the positive input of amplifier 405. If offset generation circuit 422 is configured to generate an offset into the positive input of amplifier 405, based on the result of the calibration phase, then current it is combined with current from inverter 410, where current it reduces the offset of amplifier 405. Similarly, inverter 411 sources or sinks current into the negative input of amplifier 405. If offset generation circuit 423 is configured to generate an offset into the negative input of amplifier 405, based on the result of the calibration phase, then current i2 is combined with current from inverter 411, where current i2 reduces the offset of amplifier 405. In some memory applications, a plurality of the sense amplifiers are calibrated simultaneously in response to a single control signal. For instance, offset in multiple sense amplifiers 405 may be calibrated and/or corrected during an operational phase using one control signal. The control signal may be coupled to multiple sense amplifiers to activate the sense amplifiers in banks, for example.

One advantage of the example implementation in FIG. 4 is that lower offsets in amplifier 405 increase the speed of the memory because amplifier 405 is able to resolve differential data bit values stored in memory cell 401 faster, which improves amplification throughput and latency. Another advantage of this example is that reducing offset in amplifier 405 increases the yield of an integrated circuit memory, especially at lower voltages, because as offset in amplifier 405 goes down, the memory can perform read operations across a wider range of manufacturing variations. Yet another advantage of this implementation is that reduced offset in amplifier 405 allows amplifier 405 to resolve the inputs using less power.

Particular embodiments of the present invention may be used to implement offset adjustment in sense amplifiers using a small number of transistors (e.g., 100's or 1000's per chip). This may be advantageous in high density memory applications having a large number of sense amplifiers, for example. In one embodiment, the output of sense amplifier 405 is coupled to two latches: one for storing a condition where the offset is greater than a first value (e.g., 100 mV) and another for storing a condition where the offset is less than a first value (e.g., −100 mV). In one particular embodiment, offset generations circuits 422 and 423 are configured to generate predetermined offset voltages (e.g., +/−200 mV) for amplifier 405. Opposite polarity offset is applied during the operational phase at the input of amplifier 405 if one of the latches is set during calibration, indicating that the output of the amplifier 405 was either above or below a predefined threshold value. Accordingly, offset detection circuit 420 may comprise two latches, for example, for capturing the above two conditions.

For example, in one embodiment, during calibration WL 404 may be low to disconnect memory cell 401, transistors 450 and 451 may be turned on, and the inputs of sense amplifier 405 may be precharged to Vdd using transistors 460-461 (i.e., PRECHG=0V). Next, transistors 460 and 461 are turned off and the positive input of sense amplifier 405 may be driven by a current pulse from offset generation circuit 422 by turning on transistor 424 for a time period corresponding to the amount of offset to be injected. For example, a current pulse may be configured to last a time period sufficient to produce a 100 mV offset. After the offset has been injected, the output of amplifier 405 may be monitored. For example, if 100 mV of negative offset is applied to the positive input, it would be expected that the output is negative. However, if the output remains positive, then the offset is greater than 100 mV. As mentioned above, offset detection circuit 420 may include a latch that is triggered if the output of amplifier 450 is positive. Thus, the latch may store a flag that indicates that a negative offset is to be generated during an operational phase. Accordingly, during an operational phase, when memory cell 401 is activated by word line 404, a negative offset (e.g., 200 mV) may be injected simultaneously into the positive input of amplifier 405 to cancel the offset voltage of amplifier 405. The negative (or canceling) offset injected during operational phase may be up to two times (2×) the offset used during the calibration phase for detecting offset, for example. Increasing the injected offset up to 2× the offset used during calibration phase may further improve the overall distribution of the sense amplifier offsets in memory circuit such that speed, yield, or power is improved. In this embodiment, storage of final offset voltage of sense amplifiers is not required and the amount of circuitry and calibration time is minimized. Accordingly, in some embodiments, steps 307-310 and 317-320 may be omitted.

One advantage of the above example is that the mechanism for detecting offset is the same as the mechanism for canceling offset, which reduces the number of transistors required to implement the circuit and reduces mismatch errors, for example. It is to be understood that a similar technique may be employed for detecting negative offsets. For example, if the output of amplifier 405 goes negative in response to negative offset injection by offset generation circuit 422 as mentioned above, then another offset may be injected by offset generation circuit 423 during calibration phase. In this case, a second latch in offset detection circuit 420 may be triggered if the output of amplifier 405 is negative. Accordingly, the calibration phase may include both positive and negative offset injection testing described above, and cancelling offset may be injected into either the positive or negative inputs of amplifier 405 as required during the operational phase (e.g., during a read operation).

Figure 5:
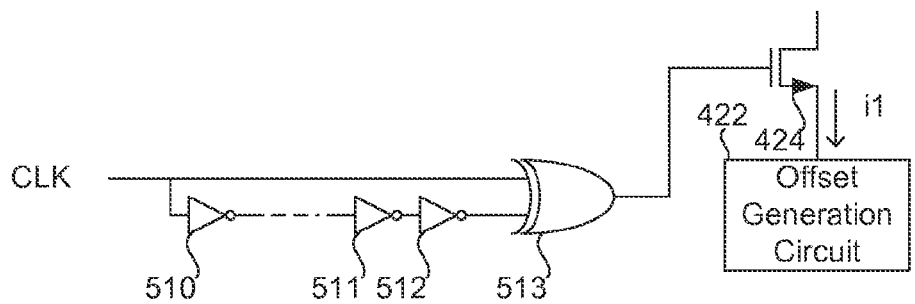
FIG. 5 illustrates circuit for generating offset according to one embodiment.

FIG. 5 illustrates a circuit for generated offset according to one embodiment. In this example, transistor 424 may be turned on for a period of time corresponding to a particular offset to be injected as described above. The amount of offset generated is set by the current it from offset generation circuit 422 and the pulse width of a pulse generated at the gate of transistor 424. Here, the pulse is generated by an XOR gate 513 and inverters 510-512. Inverters 510-512 delay a clock signal so that XOR gate 513 generates a pulse having a pulse width set by the delay of the inverters. Accordingly, the circuit delivers a specified amount of offset to the input an amplifier 450 as set by the inverter delays and the magnitude of the current i1. The circuit shown in FIG. 5 is advantageous in that the offset injected is stable across process and temperature variations of transistor 424. For example, if transistor 424 is fast, the inverters will also be fast and the pulse will be shorter. Conversely, if transistor 424 is slow, the inverters will also be slow and the pulse will be longer.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while the some of the above embodiments have been disclosed using PMOS and NMOS, other embodiments may use other types of transistors. As a further example, one or more steps of methods or processes discussed above may be performed in a different order (or concurrently) and still achieve desirable results. Based on the above disclosure and the following claims, other arrangements, embodiments, implementations and equivalents may be employed without departing from the scope of the invention as defined by the claims.

What is claimed is:

1. A method for determining offset in an amplifier, the method comprising:

generating, using offset generation circuitry, an offset value at an input of an amplifier;

determining, using offset detection circuitry, whether an output of the amplifier is greater than an output threshold; and setting, using control circuitry, an offset inject value which indicates that an offset should be generated at the input of the amplifier if the output is determined to be greater than the output threshold, wherein the offset inject value is equal to the offset value plus an additional fixed amount.

2. The method of claim 1, further comprising:
generating an incremented offset value by incrementing the offset by an offset increment value if the output is determined to be greater than the output threshold;
determining, using offset detection circuitry, whether the output of the amplifier is greater than a output threshold; and
storing, using offset value storage circuitry, the incremented offset value if the output is less than or equal to the output threshold.

3. The method of claim 2, wherein the offset value and the incremented offset value are determined by successive approximation.

4. The method of claim 1, wherein the input of the amplifier is a first polarity input of the amplifier and the output of the amplifier is associated with the first polarity of the input.

5. The method of claim 1, further comprising storing the generated offset value if the output is determined to be greater than the output threshold.

6. The method of claim 1, wherein the output is a first output, and the output threshold is a first output threshold, and the offset inject value is a first offset inject value, and the input is a first input, and the method further comprising:
generating an offset value at a second input of the amplifier if the first output is determined to be less than or equal to the first output threshold;
determining whether a second output of the amplifier is greater than a second output threshold; and
setting a second offset inject value which indicates that an offset should be generated at the second input of the amplifier if the second output is determined to be greater than the second output threshold.

7. A circuit for determining offset in an amplifier, the circuit comprising:
an amplifier having an input and an output;
an offset generation circuit configured to generate an offset value at the input of the amplifier;
an offset detection circuit configured to determine whether the output of the amplifier is greater than an output threshold; and
a control circuit configured to set an offset inject value, which indicates that an offset should be generated at the input of the amplifier, if the output is determined to be greater than the output threshold, wherein the offset inject value is equal to the offset value plus an additional fixed amount.

8. The circuit of claim 7, wherein
the offset generation circuit is configured to generate an incremented offset value by incrementing the offset by an offset increment value if the output is determined to be greater than the output threshold, and
the offset detection circuit is configured to determine whether the output of the amplifier is greater than a output threshold, and
the circuit further comprising an offset value storage circuit configured to store the incremented offset value if the output is less than or equal to the output threshold.

9. The circuit of claim 8, wherein the offset value and the incremented offset value are determined by successive approximation.

10. The circuit of claim 7, wherein the input of the amplifier is a first polarity input of the amplifier and the output of the amplifier is associated with the first polarity of the input.

11. The circuit of claim 7, comprising further comprising an offset value storage circuit configured to store the generated offset value if the output is determined to be greater than the output threshold.

12. The circuit of claim 7, wherein
the output is a first output, and the input is a first input, and the output threshold is a first output threshold, and the offset inject value is a first offset inject value, and the amplifier comprises a second input and a second output, and
the offset generation circuit is configured to generate an offset value at a second input of the amplifier if the first output is determined to be less than or equal to the first output threshold, and
the offset detection circuit is configured to determine whether the second output of the amplifier is greater than a second output threshold, and
the control circuit is configured to set a second offset inject value which indicates that an offset should be generated at the second input of the amplifier if the second output is determined to be greater than the second output threshold.

13. A memory comprising:
a memory cell;
an amplifier having and input and an output, wherein the input has a first and second input coupled to the memory cell, and the output has a first and second output; and
a first offset circuitry coupled to one of the first input and output of the amplifier and second input and output of the amplifier, the offset circuitry comprising:
an offset detection circuit configured to detect an offset of the amplifier at one of the first and second outputs of the amplifier; and
an offset generation circuit having an input coupled to the offset detection circuit and an output coupled to one of the first and second inputs of the amplifier configured to generate an offset at one of the first and second inputs of the amplifier based on the detected offset, wherein:
the generated offset from one of the first and second offset injection circuitries is configured to cancel at least a portion of the offset of the amplifier, and
the generated offset is equal to the detected offset plus an additional fixed amount.

14. The memory of claim 13, wherein the offset detection circuit is configured to detect offset at the output of the amplifier during a calibration phase to generate the offset at the input of the amplifier, and wherein the offset at the input of the amplifier is maintained during the operational phase.

15. The memory of claim 13, wherein the detected offset at the output of the amplifier is an offset voltage.

16. The memory of claim 13, wherein the generated offset is opposite in polarity to the detected offset.

17. The memory of claim 13, wherein the offset generation circuit produces a current into the input of the amplifier to cancel at least a portion of the offset of the amplifier.

18. The memory of claim 13, wherein the offset generation circuit of the first offset injection circuitry generates a first offset into the first input of the amplifier when the detected offset at the first output of the amplifier has a first polarity and wherein the offset generation circuit of the second offset injection circuitry generates a second offset into the second input of the amplifier when the detected offset at the second output of the amplifier has a second polarity.

19. The memory of claim 13, wherein the offset generation circuit receives a digital signal to generate a particular offset value at the input of the amplifier, and wherein the digital signal is changed to produce a plurality of offset values to reduce the offset of the amplifier.

20. The memory of claim 19, wherein a final digital signal value corresponding to a final generated offset is stored in a register.

21. The method of claim 1, wherein the additional fixed amount is substantially equal to the offset value.

22. The system of claim 7, wherein the additional fixed amount is substantially equal to the offset value.

23. The system of claim 13, wherein the additional fixed amount is substantially equal to the offset value.

* * * * *